United States Patent [19]

Lanz et al.

[11] 4,063,160
[45] Dec. 13, 1977

[54] METHOD AND APPARATUS FOR LOCATING A FAULT ON A LINE BY MEANS OF TRAVELLING WAVE SIGNALS

[75] Inventors: Otto Lanz, Niederrohrdorf; Michael Vitins, Zurich, both of Switzerland

[73] Assignee: BBC Brown Boveri & Company Limited, Baden, Switzerland

[21] Appl. No.: 676,983

[22] Filed: Apr. 14, 1976

[30] Foreign Application Priority Data

Apr. 28, 1975 Switzerland ................. 5427/75

[51] Int. Cl.² ........................................... G01R 31/08
[52] U.S. Cl. .................................................... 324/52
[58] Field of Search ................. 324/52, 51; 317/36 D; 179/175.3 F

[56] References Cited

U.S. PATENT DOCUMENTS

| | | | |
|---|---|---|---|
| 3,281,673 | 10/1966 | Richardson | 324/52 |
| 3,590,368 | 6/1971 | Esclangon | 324/51 |
| 3,612,989 | 10/1971 | Souillard et al. | 324/52 |
| 3,670,240 | 6/1972 | Maranchak et al. | 324/52 |
| 3,723,864 | 3/1973 | Ricard | 324/52 |
| 3,800,215 | 3/1974 | Souillard | 324/52 |
| 3,878,460 | 4/1975 | Nimmersjo | 324/52 |
| 3,931,502 | 1/1976 | Kohlas | 324/52 X |
| 3,983,377 | 9/1976 | Vitins | 324/52 X |

*Primary Examiner*—Gerard R. Strecker
*Attorney, Agent, or Firm*—Werner W. Kleeman

[57] ABSTRACT

A method of and apparatus for locating a fault on a line in which there is formed from the voltage and current at a test or measuring location at least one signal (travelling-wave signal) associated with a travelling wave on the line and its variation with time at the test location. There are formed a number of pairs of oppositely moving travelling-wave signals corresponding to the number of phases or conductors of the line and with these travelling-wave signals or signals derived therefrom as integrands there are formed at least two time-integrals each of which is associated with a direction of wave propagation on the line. The time integrals are combined into an evaluation function characterizing the fault direction or fault distance with respect to the test or measuring location, the evaluation function corresponding to a relation prevailing at the fault location between the oppositely moving travelling waves on the line.

20 Claims, 8 Drawing Figures

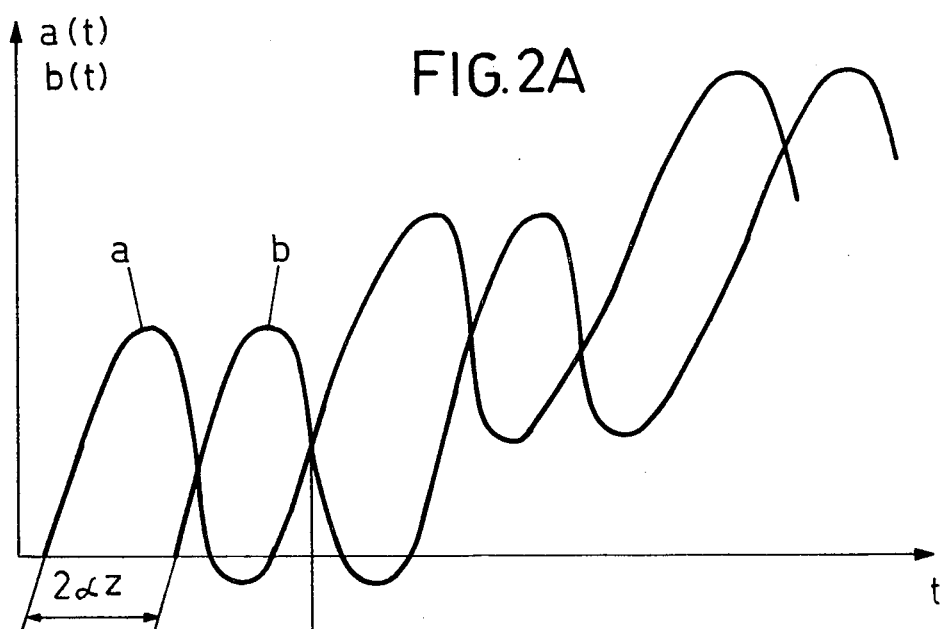
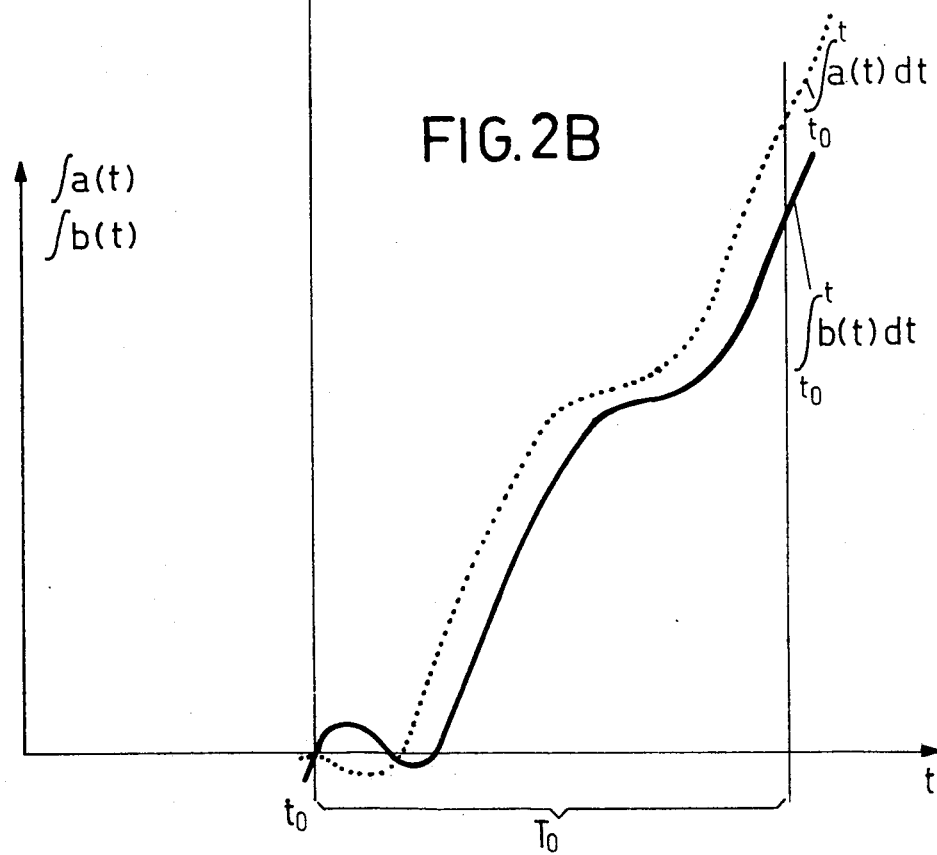

METHOD AND APPARATUS FOR LOCATING A FAULT ON A LINE BY MEANS OF TRAVELLING WAVE SIGNALS

BACKGROUND OF THE INVENTION

The present invention relates to a new and improved method of fault location on a line in which at least one signal relating to a travelling wave is formed from the voltage and current at a test or measurement location. The invention further relates to an arrangement or apparatus for carrying out such method.

By "fault location" as used in the present connection there is to be understood the determination of the direction and/or distance of a line fault in relation to a test or measuring location with measuring arrangements for inspecting the line voltages and line currents.

In practice it is usually a matter of locating voltage-reducing faults on the line, i.e. short-circuits with small and often negligible residual voltage at the fault location.

The problem is usually solved with the help of electromechanical or electronic distance relays, which essentially compare the input impedance of the faulty line with that in a normal condition and accordingly assumes the presence or the formation of at least approximately sinusoidal input signals. Such test signals are however available after decay of the transient processes initiated by the occurrence of the fault. An appropriate delay time must therefore be brought into play. Even the connection in series of filters, which filter out a suitable frequency component from the initially present broad spectrum of the transient processes or events, likewise again gives rise to a delay through its impedance-loaded transient response, and in addition represents an unwanted, additional circuit cost.

It is generally sought to keep as small as possible the time interval from fault occurrence or fault detection and energization of the distance relays until the availability of reliable information about the fault direction or fault distance.

There is therefore desired a fault location method capable of functioning even during the transient events, with its actual course of operation coming into action with as little delay as possible.

In this connection fault location methods operating with travelling waves are already known. Here a specially generated test signal with steep wave-front is generated and caused to travel along the line to be supervised. The reappearance of the wave reflected at the discontinuity position of the fault to the transmitting or test location and the duration of the time interval necessary for go and return, in combination with the known wave velocity of the line provide the distance between fault and test locations.

Besides the requirement for a special transmitter, there is here present the disadvantage of sensitivity with respect to interfering signals, such as appear in particular on heavy current and especially in high-voltage lines with high intensity and in part with steep flanks. This sensitivity is due to the fact that in the final analysis it is a matter of signal flank detection, which amounts to time differential test methods. In addition the measurement is critical for fault location positions very near the test location because of the very small transit time.

There is further known from U.S. Pat. No. 3,590,368 an arrangement operating with travelling wave signals for localizing a fault location with reference to two test stations on a line. In the two test stations there are formed from the measured voltages and measured currents travelling wave signals appropriate to only a single direction of propagation and after multiplication of one of the signals with the complex transmission factor on the line section between the two test stations are compared with one another over a control line additional to the line to be supervised. Correspondence of the compared signals denoted freedom from faults, deviation denotes the presence of a fault in the line section between the test stations.

SUMMARY OF THE INVENTION

Hence, a primary object of the present invention is the provision of a method of and an arrangement for fault location in relation to a single test or measuring station, which within a short time following fault occurrence or excitation provide a signal characterizing the fault direction and/or the fault distance with respect to the test or measuring location.

The inventive method for locating a fault on a line in which there is formed from the voltage and current at a test or measuring location at least one signal (travelling wave signal) associated with a travelling wave on the line and its variation with time at the test location, is characterized by the features that there are formed a number of pairs of oppositely moving travelling-wave signals corresponding to the number of phases or conductors of the line, that with these travelling-wave signals or signals derived therefrom as integrands there are formed at least two time-integrals, each of which is associated with a direction of wave propagation on the line. The time integrals are combined into an evaluation function characterizing the fault direction or fault distance with respect to the test or measuring location and such evaluation function corresponds to a relation arising at the fault location between the oppositely moving travelling waves on the line.

The arrangement or apparatus for carrying out the method is characterized by the following features:

a. at a test or measuring location on the line there is provided a voltage and current measuring circuit, the outputs of which provide a number, corresponding to the phases or conductors of the line, of pairs of voltage-current signals independent of one another in relation to the line inductance and line capacitance;

b. there is connected with the voltage and current measuring circuit a multiplication circuit in which at least one of the independent current signals is multiplied by a factor ($R_w$) that corresponds to a wave or characteristic impedance associated with the respective current signal;

c. with the measuring circuit and the multiplication circuit there is connected a summing circuit in which there are formed at least two oppositely moving travelling-wave signals of the form $a = u_m + R_w \cdot i_m$ and $b = -u_m + R_w \cdot i_m$ with $u_m$ and $i_m$ as a voltage-current signal pair and $R_w$ as a factor corresponding to an associated wave or characteristic impedance;

d. an integrating circuit is provided for the formation of time integrals of the travelling-wave signals and possessing an integration-interval switching device;

e. with the output of the integrating circuit there is connected an evaluation circuit which possesses at least one subtraction or comparison circuit, of which the inputs are fed with time integrals formed from mutually oppositely moving travelling-wave signals or from signals derived from these time integrals.

Thus, the formation of time integrals from oppositely moving travelling-wave signals is essential to the method according to the invention. As the "travelling-wave signal" there is designated for the sake of simplicity a signal of which the variation with time corresponds with that of a travelling wave considered at a particular location of the line. In particular there is to be understood in what follows a signal corresponding to the variation with time of a travelling wave at the test or measuring location, insofar as no other location determination of the fault location is provided elsewhere. By "oppositely travelling-wave signals" there are accordingly to be understood signals corresponding with the variation with time of oppositely moving travelling waves at a particular location on the line, especially the test or measuring location.

Integration over a definite integration interval is further essential, rendering possible logical or arithmetic processing and evaluation of the received time integral free of any appreciable time delay. The definite beginning of integration, with just such initial value at the commencement of the process makes easy, through a conventional type qualitative fault alarm ("excitation"), localization of the fault location free of any appreciable time delay, since the time required for the removal of previously stored information irrelevant to the fault location, e.g. the discharge of differently charged integrating elements across discharge elements bound to time constants is absent or at least greatly reduced. In the present method, on the other hand, the integration interval itself represents the actual signal processing time, at the end of which the determining magnitudes for fault location localization are already substantially available and only require practically delay-free logical or arithmetic combination.

It should here be remarked that the use of correlation methods with time integration corresponding to an approximate Fourier transformation of currents and voltages for determining fault locations is known (IEEE Transactions on power Applications and Systems, Vol. PAS-93, No. 5, pp. 1522–34, published Nov. 1973). Here, however, definite frequency components of voltages or currents were merely —more or less approximately— isolated by correlation filters and made available for a usual, subsequent fault location determination in accordance with an impedance method. Accordingly, in this case there is necessary an integration time of at least one period of the frequency components to be filtered out —for alternating current lines in general the supply frequency— with corresponding loss of time. This prior art technique does not operate with travelling-wave signals.

In contrast thereto with the method according to the invention it is basically unnecessary to isolate a particular frequency component or even only a narrow frequency range for the fault location localization. The minimum duration of the integration interval with the method according to the invention rather is determined in that despite the oscillations with a period in the order of the wave transmit time over the line considered and appearing in general in the travelling-wave signals, no further overlapping of the time integrals appear and, thus, at the end of the integrations a definite correspondence is given between the signs of the difference of the time integrals for the oppositely moving travelling-wave signals and the direction of the time displacement between those travelling-wave signals. For very short integration intervals this is not in general the case, since in consideration of the random position of the beginning of integration with reference to the high-frequency oscillations mentioned, the time integrals first of all exhibit corresponding random magnitude relations. Practical investigations have shown, however, that integration intervals of a few milliseconds suffice for obtaining unambiguous information as to the time shift or displacement dependent upon fault location between the travelling-wave signals and thus for an unambiguous determination of the direction of the position of the fault location with respect to the reference location.

As the evaluation function there also come into consideration other than the simple difference of a time integral of each of the two oppositely moving travelling wave signals, especially the difference of two products formed of several travelling-wave signals (as fully explained below). For such embodiments it is no longer necessarily the freedom from overlap of the time integral functions of the travelling-wave signal itself, but possibly the freedom from overlap of the substractively combined polynomial terms that are formed from the travelling wave time integral functions. In this case smaller minimum durations of the integration intervals may be sufficient as compared with those for simply forming the difference of the time integrals. There thus exists the possibility of particularly suitable evaluation functions.

The formation of travelling-wave signals having definite propagation velocities and matching wave impedances pre-supposes that no coupling exists with other travelling waves with generally different propagation velocities and wave impedances. This assumption is fulfilled at any rate for lines consisting of only one conductor or one phase and earth, so that the travelling wave signals can be formed directly from measured voltage and measured current: $a(0,t) = u_m = R_w \cdot i_m$ and $b(0,t) = u_m + R_w \cdot i_m$ with measured voltage $u_m$ and measured current $i_m$. For multiconductor systems the measured voltages and measured currents —apart from the case of very widely spaced and therefore practically uncoupled conductors or lines — must on the other hand be transformed into decoupled fictitious conductor signals.

In principle, fault location localization information is attainable by one integration for each of two oppositely moving travelling-wave signals. In the predominant application to alternating-current lines the travelling-wave signals thus now contain after the occurrence of a fault, and particularly after the occurrence of a short-circuit, a predominantly supply-frequency component, the periods of which determine the course variation and thus the rising and falling sections as well as the zero-crossings of the travelling-wave signals corresponding therewith. This dominant periodicity reappears also in the travelling wave time integrals independent of the duration of the integration interval. For one and the same time displacement between the oppositely moving travelling waves there thus result inverted magnitude ratios of the time integrals for the random position of the integration interval in the rising or falling branches of the time variation of the integration time interval. In order to remove the thus occasioned ambiguity as regards the decision as to the direction of the fault location with respect to the test or measuring location, there is either necessary an additional detection of the timing of the fault occurrence with respect to the period of the dominant supply frequency component —e.g. a conventional type phase detection— or the formation of a plurality — in general two— time integrals for at least one of the two oppositely moving travelling-wave signals. The last mentioned multiple integration for each direction of propagation is preferably employed since this requires only relatively small expansion of the process steps or of the relevant circuit.

The formation of two time integrals for each travelling-wave signal with a time displacement between the respective integral signals is especially suitable. The magnitude of this time displacement is to be matched to the period of the dominant fundamental frequency or oscillation of the travelling-wave signals assumed for alternating-current lines. A displacement of the order of magnitude of a quarter period of the fundamental frequency or oscillation is suitable. The evaluation function may then suitably be developed in the form of a polynomial product of the four time integrals, each of the two polynomial terms represents the product of a time-integral of a travelling-wave signal with a time integral of the other, and in fact the displaced travelling-wave signal. In this manner an unambiguous association of the sign of the evaluation function with the direction of the fault location with respect to the test or measuring location may again be produced. A corresponding result may also be attained by multiple integration with different integration intervals and by weighting the travelling-wave signals with various, especially time-displaced weighting functions for each direction of propagation as well as integration of the weighted functions thus obtained.

BRIEF DESCRIPTION OF THE DRAWINGS

The invention will be better understood and objects other than those set forth above, will become apparent when consideration is given to the following detailed description thereof. Such description makes reference to the annexed drawings wherein:

FIG. 2A shows a time diagram of two oppositely moving travelling-wave signals;

FIG. 2B shows a time diagram of the time-integral functions of the travelling-wave signals belonging to FIG. 2A;

DETAILED DESCRIPTION OF THE INVENTION

Figure 1:
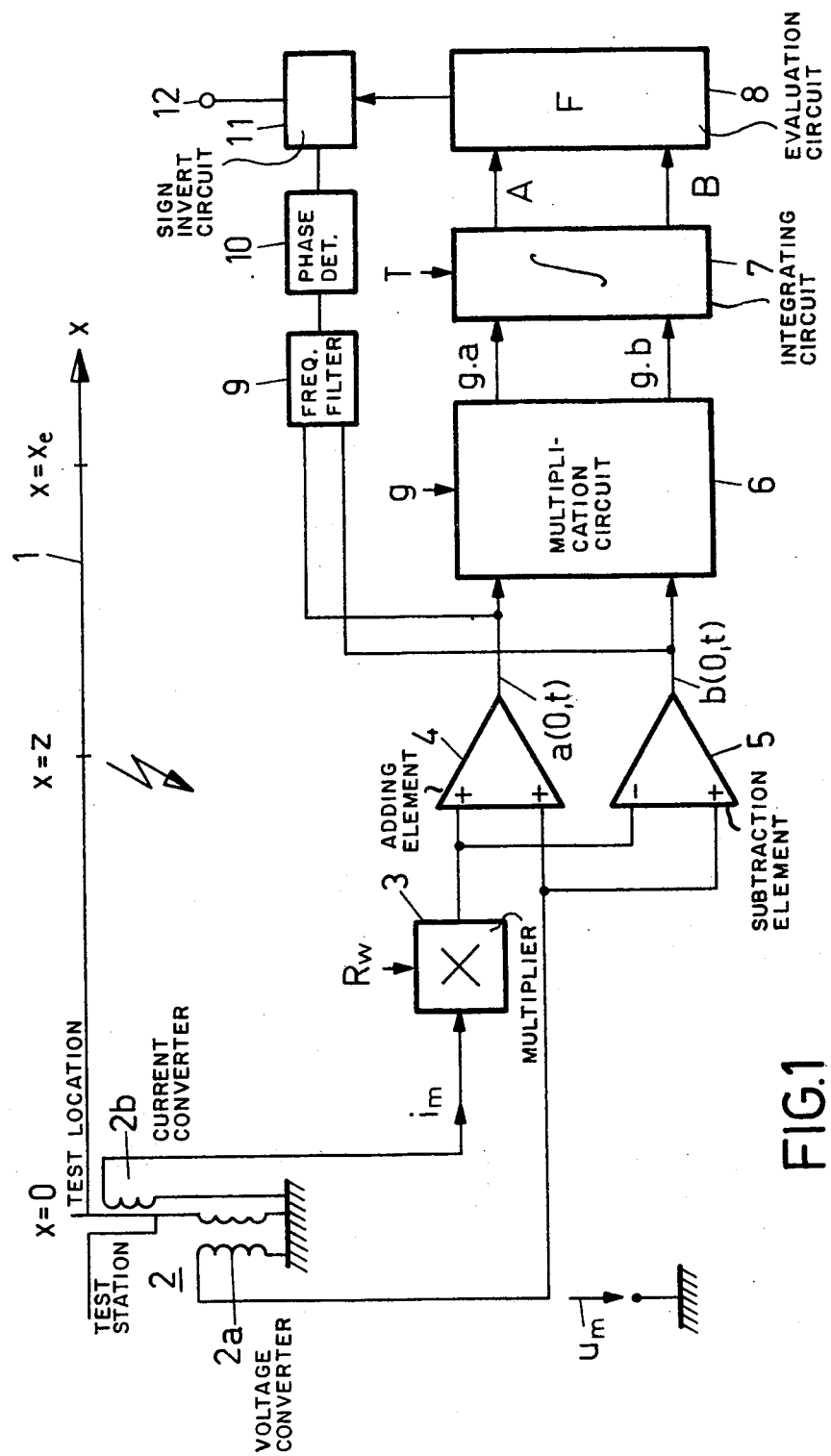
FIG. 1 is a block circuit diagram of a line with test or measuring station as well as signal processing and evaluation circuits.

First of all the mode of operation of the invention will be described with reference to FIGS. 1 to 5 for a line consisting of one conductor 1 (see FIG. 1) with a test or measuring station 2 at test or measuring location $x = 0$, from which location the line coordinate $x$ for instance is considered as positive towards the right. Accordingly let $x = x_e$ be the end of a line section to be considered, $x = z$ the location of a fault assumed as a short-circuit with zero leak- or cross-resistance.

The test or measuring station 2 comprises a voltage converter 2a for detection of the measurement voltage or voltage signal $u_m$ and a current converter 2b for detection of the test current or current signal $i_m$. In a multiplier 3 the test current $i_m$ is multiplied by a factor that has the significance of a wave or characteristic impedance, thus in the case of a simple example of the real or effective resistance given directly by the line constants L' and C' (characteristic inductance and capacitance per unit length), if freedom from loss is assumed by $R_w = \sqrt{L'/C'}$. In subsequent adding and subtracting elements 4 and 5 there are then formed the oppositely moving travelling-wave signals $$a(0,t) = u_m(t) + R_w \cdot i_m(t)$$

and $$b(0,t) = u_m(t) + R_w \cdot i_m(t) \qquad (1)$$

The following considerations are introduced for explanation of the further signal processing: From the wave equations $$\frac{du(x,t)}{dx} + L' \frac{di(x,t)}{dt} = 0, \quad \frac{di(x,t)}{dx} + C' \frac{du(x,t)}{dt} = 0 \qquad (2)$$

for the line assumed as loss-free with the line voltage $u(x,t)$ and the line current $C(x,t)$, there result for the fault condition at fault location $x = z$, in the case of the example of the short-circuit condition, that is $$u(z,t) = 0 \qquad (3)$$

the solutions ($\alpha = \sqrt{L'C'}$ = reciprocal of the wave propagation velocity).

$$2u(x,t) = R_w(i(z,t + \alpha(z-x)) - i(z,t - \alpha(z-x))) \qquad (4)$$
$$2i(x,t) = i(z,t + \alpha(z-x)) + i(z,t - \alpha(z-x)),$$

where $i(z,t)$ is the current at the fault location i.e. the short-circuit current. Thereafter, as is clear from the expression $$2u(x,t) = a(x,t) + b(x,t), \qquad (5)$$

the line voltage at any location on the line is combined additively with the oppositely moving travelling waves $$a(x,t) = R_w i [z, t + \alpha(z-x)] \qquad (6)$$
and
$$b(x,t) = R_w i [z, t - \alpha(z-x)].$$

For the combination of these travelling waves, which have the dimension of a voltage, with the line voltages and line currents, there applies, because of Equations (4) and (6), the relation $$a(x,t) = u(x,t) + R_w i(x,t) \qquad \text{and} \qquad (6a)$$
$$b(x,t) = -u(x,t) + R_w i(x,t).$$

At this point it is remarked, that analagous travelling wave and fault location conditions also can be established for line breaks, with zero current at the fault location and evaluated for fault location localization. In addition the indicated fault location localization or delimiting can be analagously employed for line faults lying between short-circuit and open circuit with reflection of the travelling waves at the position of the fault.

Thus, for the test or measuring location $x = 0$ there applies $$a(0,t) = R_w \cdot i(z, t + \alpha z) \quad \text{and} \quad b(0,t) = R_w \cdot i(z, t - \alpha x). \tag{7}$$

In the mutual time displacement of the oppositely moving travelling-wave signals $$\Delta t = 2\alpha z \tag{8}$$

there is thus contained sufficient information for fault localization by sign and in some cases the value of $z$. Direct determination of the displacement intervals relevant to the fault location encounters substantial difficulties, so that the present invention contemplates the evaluation of time integrals of the travelling-wave signals, namely that of combining these time integrals through an evaluation function characterizing the direction of the fault location or the distance of the fault location with respect to the test or measuring location.

Such a decision as to direction may be put into practice through comparitively simple evaluation functions, for example even by a simple, subtractive combination of two integrals of oppositely moving travelling-wave signals, provided that there is carried out an additional detection of the position as a function of time of the integration intervals with respect to the ascending or descending halfwaves of a dominant fundamental frequency or oscillation usually present in the spectrum of the travelling-wave signals. In the description to follow such a simple evaluation function is assumed only for the sake of simplicity in explanation, although in practice this is hardly sufficient. Thus $$F = A(t) - B(t) = \int_{t_0}^{a'} (0,t)dt - \int_{t_0}^{b'} (0,t)dt \text{ where} \tag{9}$$

$F = 0$ for $z = 0$ in accordance with Equation (3) and $2u(z,t) = a(z,t) - b(z,t) = 0$, \quad (10)

$F \lessgtr 0$ for $z \lessgtr 0$ or inversely $F \gtrless 0$ for $z \gtrless 0$, \quad (11)

in any case however with inversion of the sign of F for fault locations on either side of 0, since this is basically sufficient for decision of the direction — apart from the previously explained additional phase detection.

In the circuit arrangement in accordance with FIG. 1 the time integrals are carried out in an integrating circuit 7 driven at its input with $a(0,t)$ and $b(0,t)$ with a control or adjusting input T for the integration intervals. There are thus available at the outputs of the integrating circuit 7 the time integrals A and B for determining the sign and/or amount of $z$ in the subsequent evaluation circuit 8, in which the previously explained evaluation function F is formed from A and B. For the case of the simplest evaluation function with addition determination of the phase position of the time integrals with respect to a dominant travelling wave fundamental oscillation there is provided a phase detector 10 controlled by a frequency filter 9 and to which there is further applied the integration intervals T of the integration circuit 7 and which determines from these the phase position or phasing of these intervals with respect to the fundamental oscillation and correspondingly controls a sign or polarity inverting circuit 11 arranged following the output of the evaluation circuit. At the terminal output 12 of the circuit the correctly poled signal for $z$ is thus always available.

It should be generally noted that the above-discussed phase detection also applies for those cases where, as a result of the filtering effect of the weighting and/or the integration, the dominant frequency components appear only in the modified travelling-wave signals or in the time integral functions of the latter or show up as a dominant frequency component of the original travelling-wave signals. It thus depends finally on the dominant periodicity of the integral functions entering into the evaluation function, which is to be taken into account in respect of unambiguous decision between the signs of the evaluation function and the direction of the fault location with respect to the test location.

Figure 3:
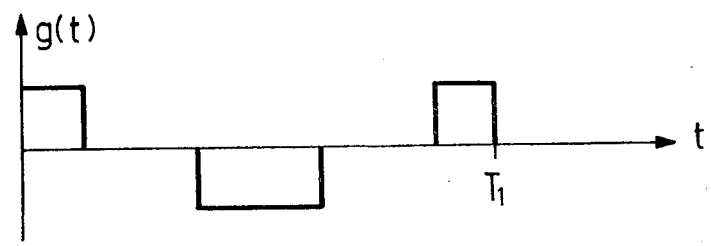
FIG. 3 shows the time diagram of a weighting function usable for an embodiment with weighted travelling-wave signals.

The integration for the assumed simple evaluation function $F = A - B$ will now be functionally explained with reference to FIGS. 2 and 3.

In FIG. 2A there is illustrated the travelling-wave signal $a(0,t)$ which trails $b(0,t)$ through the shortcircuit by $2\alpha z$, with intersections between $a$ and $b$ which make the determination of the sign of $t = 2\alpha z$ by simple subtraction of signal values at definite times impossible. On the contrary the time integral functions indicated in FIG. 2B, even with the unsuitably chosen time $t_o$ of commencement of integration in the region of the zerocrossing of the integrands, provide increasingly divergent function values $A(t)$ and $B(t)$ with increasing integration time, which yield an evaluation function $F = A - B$ with unambiguous sign determination in the sense explained above. For example $T_o$ in the practical case of alternating-current lines amounting to about 3 m.sec, may be considered as definitely sufficient minimum integration time.

Figure 4:
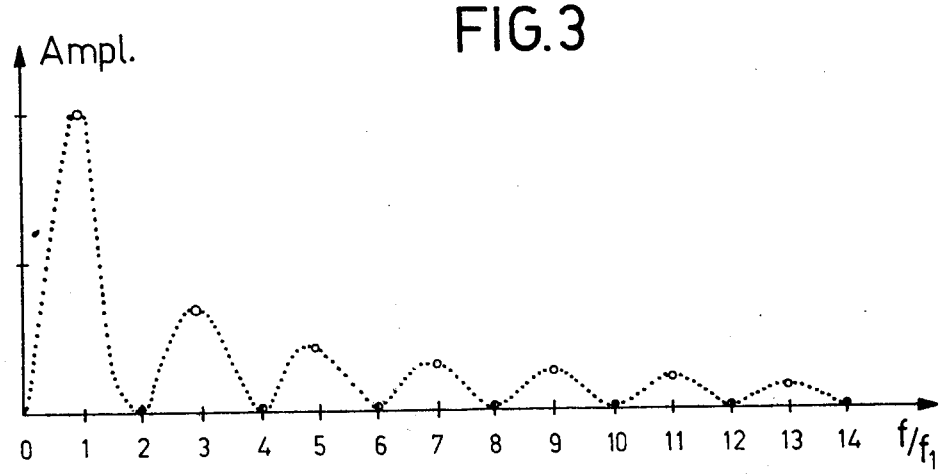
FIG. 4 shows the amplitude spectrum of the weighting function of FIG. 3.

In particular, the travelling-wave signals in accordance with FIG. 1 may be multiplied in a multiplication circuit 6 by a weighting function $g$, having a selective filtering action with respect to a predetermined frequency in the spectrum of the travelling-wave signals. In FIG. 3, there is indicated an example of such a weighting function with the period $T_1$, corresponding to an accentuated frequency $f_1$, while FIG. 4 shows the frequency response with principal maximum at $f_1$. Time integrals of the travelling-wave signals thus obtained are particularly suitable for evaluation functions, the values of which are to provide a measure of the distance of the fault from the reference location.

Figure 5:
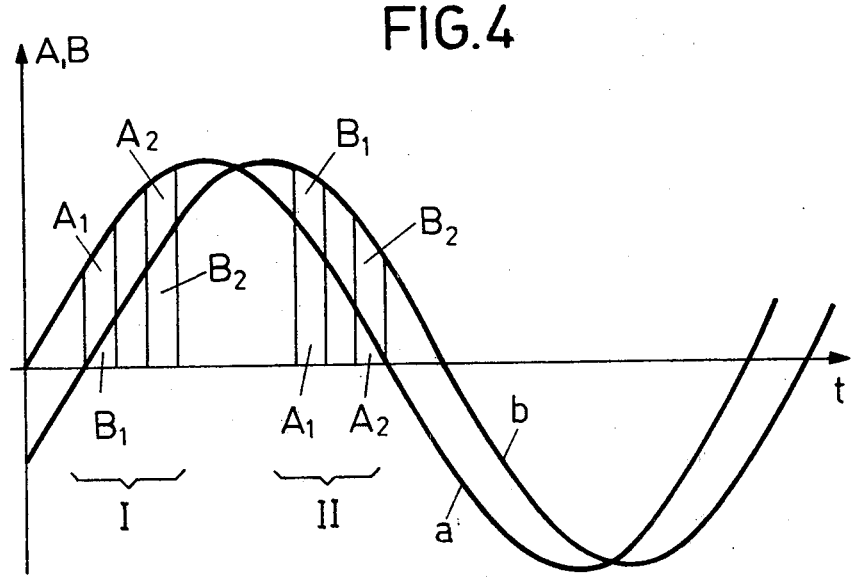
FIG. 5 shows the time diagram of a multiple integration for the oppositely moving travelling-wave signals.

FIG. 5 shows the formation of several time-integrals with mutual displacement for each travelling-wave signal, namely $A_1$ and $A_2$ and also $B_1$ and $B_2$, the integration intervals for $A_1$ and $B_1$ and for $A_2$ and $B_2$ being coincident. For the sake of simplicity only one frequency component, assumed as the dominant, is indicated for the variation with time of the travelling-wave signals $a$ and $b$. An evaluation function, formed for example from the time integrals, namely $F = A_1 \cdot B_2 - A_2 \cdot B_1$ has the characteristic of its sign being independent of the phasing of the integration intervals with respect to the periods of the dominant travelling wave components and therefore makes the above-mentioned additional phase detection superfluous. This independence of sign can be verified from the different phase positions or phasings I and II of the time integrals introduced into FIG. 5.

Furthermore the above-mentioned multiple time can be used for the formation of an evaluation function $$F = \arctan \frac{A_1 \cdot B_1 - A_2 \cdot B_2}{A_1 \cdot B_1 + A_2 \cdot B_2}$$

which for integration times of a fraction of the periodic time of the dominant frequency is still proportional to z with good approximation, but in any case represents a measure of the fault distance.

Figure 6:
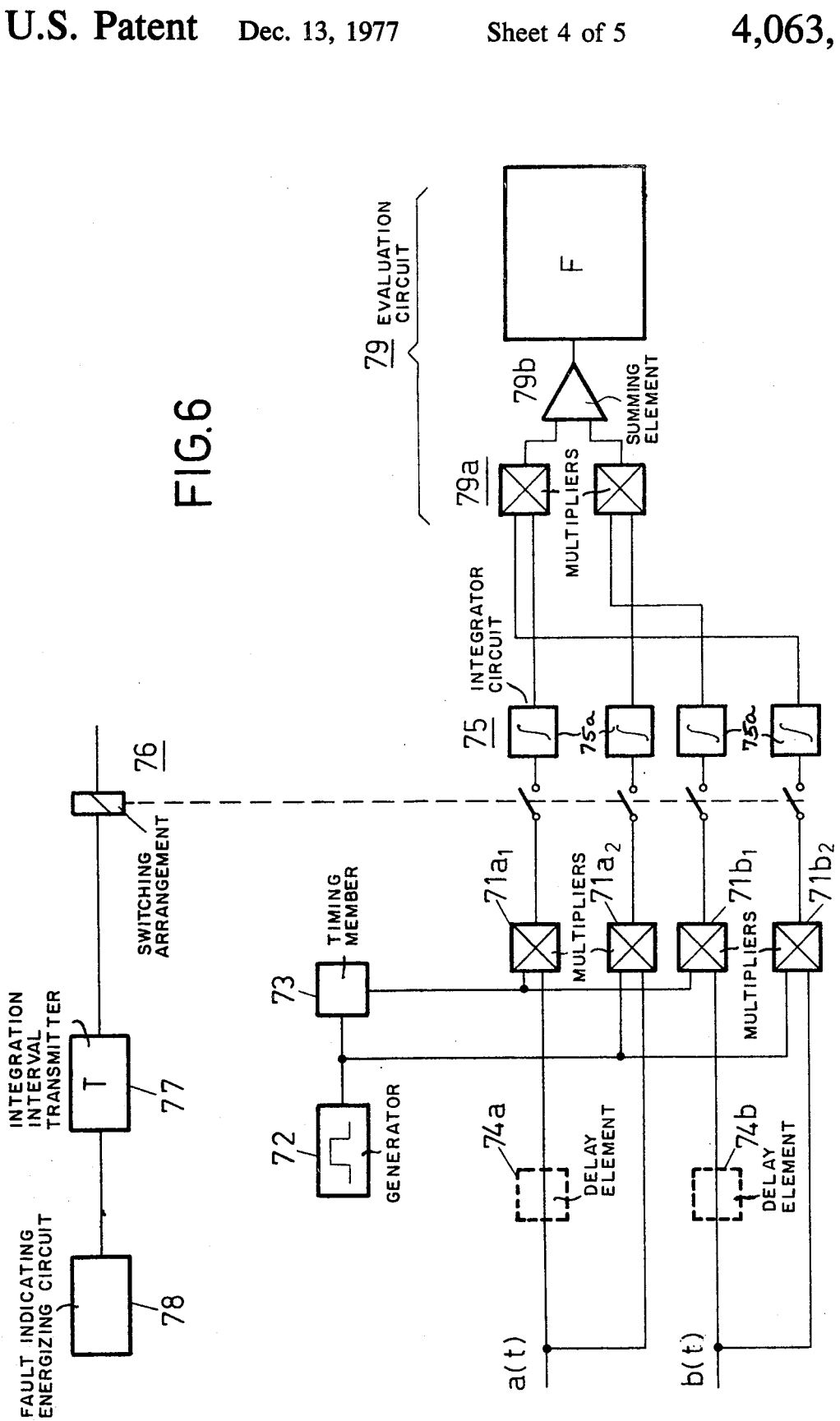
FIG. 6 shows the basic block circuit diagram of an arrangement for fault location with multiple integration and formation of a correspondingly composed evaluation function.

FIG. 6 shows in detail a circuit arrangement with two signal channels for $a(0,t)$ and $b(0,t)$, that are branched for a multiple integration and each provided with a multiplier 71a1, 71a2 and 71b1, 71b2 for weighting with a rectangular switching function supplied by a generator 72. For each branch of each of the two channels $a(0,t)$ and $b(0,t)$ there is provided a delay of the weighting function through a timing element or member 73, for instance in the form of a monostable trigger stage with adjustable switching time. Thus, correspondingly delayed function sections of $a(0,t)$ and $b(0,t)$ are gated and multiple integration in the manner of FIG. 5 with sign unambiguousness of the evaluation function is achieved. Alternatively to this or in some cases also in addition thereto delay elements 74a, 74b can be provided directly in the respective channels. There follows an integrator circuit 75 with an integrator 75a for each travelling-wave signal channel branch and with a common switching arrangement 76 that is initiated or activated by a conventional fault indicating energizing circuit 78 through the agency of an integration interval transmitter 77. In an analogous and therefore not represented manner the switching arrangement 76 also controls the discharge of the integrators after evaluation is effected. The latter takes place in an evaluation circuit 79 with multipliers 79a and also a summing element 79b for the formation of the evaluation function $F = A_1 \cdot B_2 + A_2 \cdot B_1$.

Figure 7:
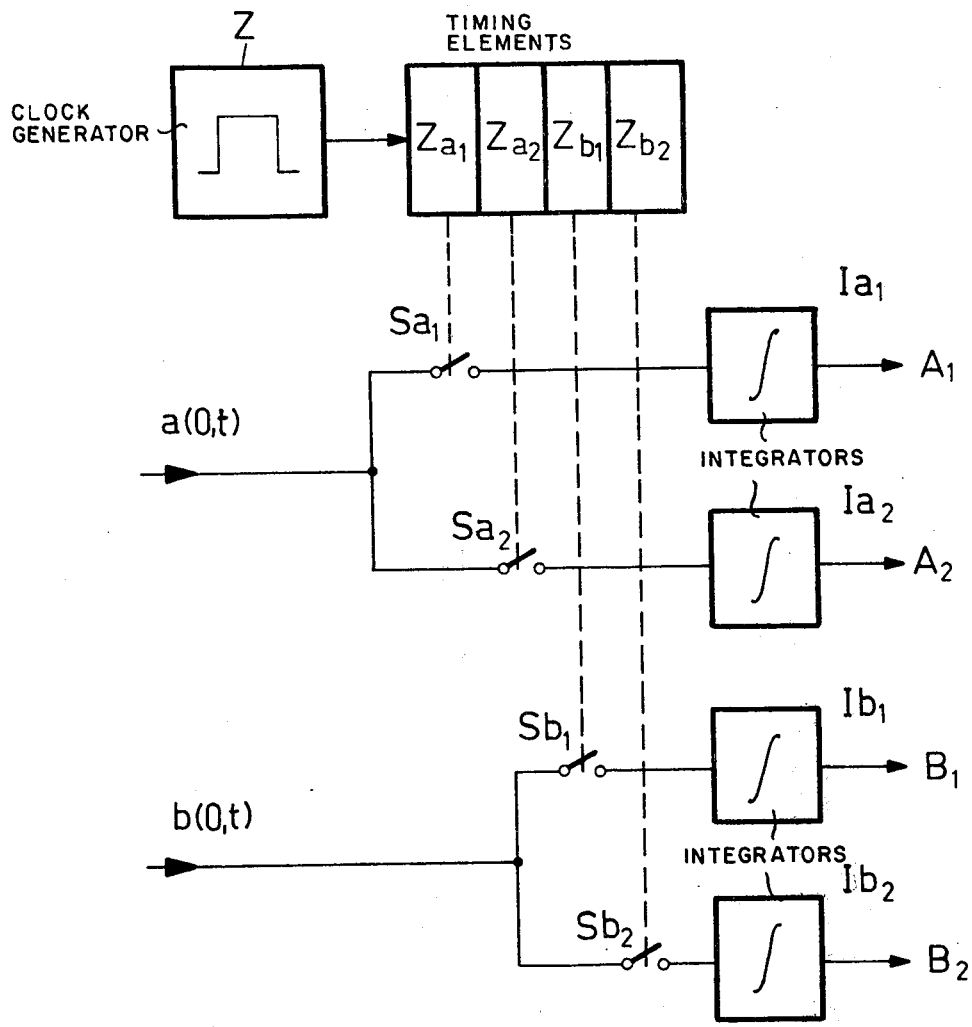
FIG. 7 shows a modified integration circuit, usable in an arrangement in accordance with FIG. 6.

FIG. 7 shows an embodiment with different integration interval control of the travelling-wave signal channels $a(i\,0,t)$ and $b(0,t)$ branched for multiple integration by way of respective switches Sa1, Sa2 and Sb1, Sb2 with associated timing elements Za1, Za2, Zb1; Zb2 for the individual integrating interval switches and a common clock generator Z. Here also the following integrators Ia1 to Ib2 provide the time integrals $A_1$, $A_2$ and $B_1$, $B_2$ for the formation of an evaluation function $F = A_1 B_1 - A_2 B_1$. With this circuit also a multiple integration is achieved, e.g. such as is shown in FIG. 5.

Moreover, distinguishing of the integrals for the multiple-integration according to FIG. 5 can be realized not only by different measurement of the integration integrals, i.e., mutual displacement or different duration of such intervals and by time-displacement of the travelling wave signals themselves, but also by multiplication with weighting functions of a type having other than a square-wave time course and mutual shifting as a function of time of the predominant part of the time integral of such weighting functions.

Finally, it is to be noted that the present formation and processing and also evaluation of travelling-wave signals is not limited to the introduction of measuring signals $u_m$ and $i_m$ proportional to the line voltage and line current. Often additional transformations of the measuring signals initially proportional to the line voltage and line current can possibly be effected, such as amplitude limiting or the introduction of voltage or current components for obtaining a sufficient signal level, and the like. The fault location or direction detection as described may nevertheless be achieved in the manner set forth. In addition, the integration may be carried out — even though with more trouble and with increased circuit cost — with the current and voltage signals before the combination of the travelling-wave signals.

While there are shown and described present preferred embodiments of the invention, it is to be distinctly understood that the invention is not limited thereto, but may be otherwise variously embodied and practiced within the scope of the following claims.

Accordingly, we claim:

1. A method for locating a fault on a line in which there is formed from the voltage and current at a measuring location at least one signal (travelling-wave signal) associated with a travelling wave on the line and its variation with time at the measuring location, comprising the steps of forming a number of pairs of oppositely moving travelling-wave signals corresponding to the number of phases or conductors of the line, forming from these travelling-wave signals or signals derived therefrom as integrands at least two time integrals, each of which is associated with a direction of wave propagation on the line, processing said time integrals into an evaluation function characterizing at least any one of the fault direction and fault distance with respect to the measuring location and which evaluation function corresponds to a relation arising at the fault location between the oppositely moving travelling waves on the line.

2. The method as defined in claim 1, including the step of forming the time integrals over integration intervals with definite beginning and end points.

3. The method as defined in claim 1, wherein the time integrals are formed for travelling-wave signals multiplied by at least one temporal weighting function.

4. The method as defined in claim 3, including the step of employing weighting functions with values which are constant for periods of time.

5. The method as defined in claim 4, including the step of employing switching functions as weighting functions.

6. The method as defined in claim 3, wherein the time integrals are formed from travelling-wave signals mutiplied by at least two different weighting functions.

7. The method as defined in claim 6, including the step of using weighting functions convertible into one another by temporal displacement and multiplication by a temporally constant factor.

8. The method as defined in claim 2, wherein the time integrals formed from oppositely moving travelling-wave signals at least exhibit integration intervals of different duration.

9. The method as defined in claim 2, wherein the time integrals formed from oppositely moving travelling-wave signals at least exhibit integration intervals of different position.

10. The method as defined in claim 1, including the steps of forming for at least one direction of propagation at least two time integrals with a time displacement between the travelling-wave signals employed for forming the associated integrands, and forming from the time integrals thus obtained an evaluation function with at least two subtractively combined expressions of these time integrals.

11. The method as defined in claim 1, including the steps of forming for at least one direction of propagation at least two time integrals with different integration intervals, and forming an evaluation function with at least two subtractively combined expressions of these time integrals.

12. The method as defined in claim 1, wherein each travelling-wave signal associated with a direction of propagation is multiplied by at least two different weighting functions, and that from the product functions thus obtained for each direction of propagation there are formed a corresponding number of time-integrals and an evaluation function with at least two subtractively combined products of these time integrals.

13. The method as defined in claim 12, including the step of multiplying each travelling-wave signal associated with a direction of propagation by at least two weighting functions time displaced to one another.

14. An arrangement for locating a fault on a line with respect to a measuring location in which there is formed from the voltage and current at the measuring location at least one signal (travelling-wave signal) associated with a travelling wave on the line and its variation with time at the measuring location, comprising the combination of:
   a. a voltage and current measuring circuit having output means and provided at the measuring location on the line, the output means providing a number, corresponding to the phases or conductors of the line, of pairs of voltage-current signals ($u_m$, $i_m$) independent of one another in relation to the line inductance and line capacitance;
   b. a multiplication circuit connected with the voltage and current measuring circuit, said multiplication circuit serving to multiply at least one of the independent current signals ($i_m$) by a factor $R_w$ that corresponds to a characteristic impedance associated with the respective current signal;
   c. a summing circuit connected with the measuring circuit and the multiplication circuit, said summing circuit forming at least two oppositely moving travelling-wave signals of the form $a = u_m + R_w \cdot i_m$ and $b = -u_m + R_w \cdot i_m$ with $u_m$ and $i_m$ as a voltage-current signal pair and $R_w$ as a factor corresponding to an associated characteristic impedance;
   d. an integrating circuit for the formation of time integrals of the travelling-wave signals, said integrating circuit being provided with an intergration-interval switching device;
   e. an evaluation circuit connected with an output side of the integrating circuit, said evaluation circuit having inputs to which there are applied time integrals formed from mutually oppositely moving travelling-wave signals or signals derived from these time integrals.

15. The arrangement as defined in claim 14, wherein the evaluation circuit comprises at least one subtraction circuit.

16. The arrangement as defined in claim 14, wherein the evaluation circuit comprises at least one comparison circuit.

17. The arrangement as defined in claim 14, including travelling wave-signal channels for the formation of several time integrals, said travelling wave-signal channels being branched-off for each of the oppositely moving travelling-wave signals, each branch channel is provided with a single integrator with an integration interval different with respect to the other branch channels for the same travelling wave direction.

18. The arrangement as defined in claim 17, wherein the travelling wave-signal channels are branched for the formation of several time integrals for each of the oppositely moving travelling-wave signals, and a delay element is provided in each branch channel.

19. The arrangement as defined in claim 14, further including branched travelling-wave signal channels for the formation of several time integrals for each of the travelling-wave signals, a multiplier and weighting function generator means provided for each branch channel.

20. The arrangement as defined in claim 14, wherein the integrating circuit is connected to outputs of the summing circuit.

* * * * *